United States Patent [19]
Sukegawa

[11] Patent Number: 5,572,466
[45] Date of Patent: Nov. 5, 1996

[54] FLASH MEMORY CHIPS

[75] Inventor: Hiroshi Sukegawa, Tokyo, Japan

[73] Assignee: Kabushiki Kaisha Toshiba, Kawasaki, Japan

[21] Appl. No.: 132,313

[22] Filed: Oct. 6, 1993

[30]    Foreign Application Priority Data

Oct. 6, 1992   [JP]   Japan ................... 4-267212

[51] Int. Cl.⁶ ................................................. G11C 17/00
[52] U.S. Cl. ..................... 365/185.33; 365/185.11; 365/185.12; 365/185.29; 365/230.01; 365/230.03; 365/230.06; 365/239
[58] Field of Search .................. 365/900, 230.01, 365/185, 230.05, 185.33, 185.11, 185.12, 185.29, 230.03, 230.06, 239

[56]           References Cited

U.S. PATENT DOCUMENTS 4,817,035   3/1989   Timsit .
  4,849,929   7/1989   Timsit .
  5,270,979  12/1993   Harari et al. ........................... 365/218
  5,291,584   3/1994   Challa et al. ........................... 395/500
  5,297,148   3/1994   Harari et al. ........................... 371/10.2

FOREIGN PATENT DOCUMENTS 4-57295    2/1992   Japan .

*Primary Examiner*—Viet Q. Nguyen
*Attorney, Agent, or Firm*—Oblon, Spivak, McClelland, Maier & Neustadt, P.C.

[57]            ABSTRACT

A plurality of consecutive sector numbers are assigned to a plurality of flash EEPROM chips in a semiconductor memory system. The results of assigning the consecutive sector numbers are held in an address conversion table as address conversion information. Thus, the flash EEPROM chips are simultaneously accessed when a host CPU designates the consecutive sector numbers for the same track. The access speed of the semiconductor memory system can therefore be increased when the system is controlled by the existing disk access method in which the sectors to be accessed sequentially are assigned to the same track. The semiconductor memory system can thereby be used efficiently in place of a data storage disk.

10 Claims, 14 Drawing Sheets

FIG. 3A (PRIOR ART)  `| 0 0 0 0 0 0 | 0 0 | ALL 0 ~ ALL 1 |` 16 ... 0
FIG. 3B (PRIOR ART)  `| 0 0 0 0 0 0 | 0 1 | ALL 0 ~ ALL 1 |` 16 ... 0
FIG. 3C (PRIOR ART)  `| 0 0 0 0 0 0 | 1 0 | ALL 0 ~ ALL 1 |` 16 ... 0
FIG. 3D (PRIOR ART)  `| 0 0 0 0 0 0 | 1 1 | ALL 0 ~ ALL 1 |` 16 ... 0
FIG. 3E (PRIOR ART)  `| 0 0 0 0 0 1 | 0 0 | ALL 0 ~ ALL 1 |` 16 ... 0
6 BITS    2 BITS    9 BITS
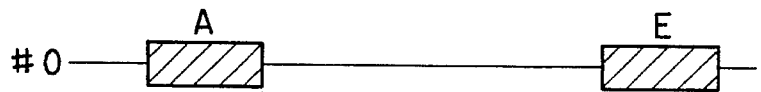
FIG. 4A (PRIOR ART) #0 — A ... E
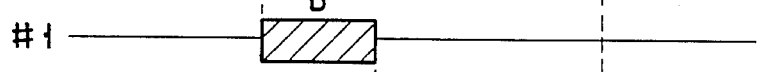
FIG. 4B (PRIOR ART) #1 — B
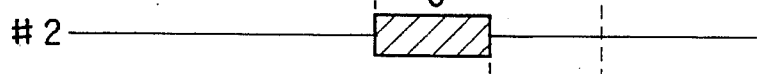
FIG. 4C (PRIOR ART) #2 — C
FIG. 4D (PRIOR ART) #3 — D
⟶ t

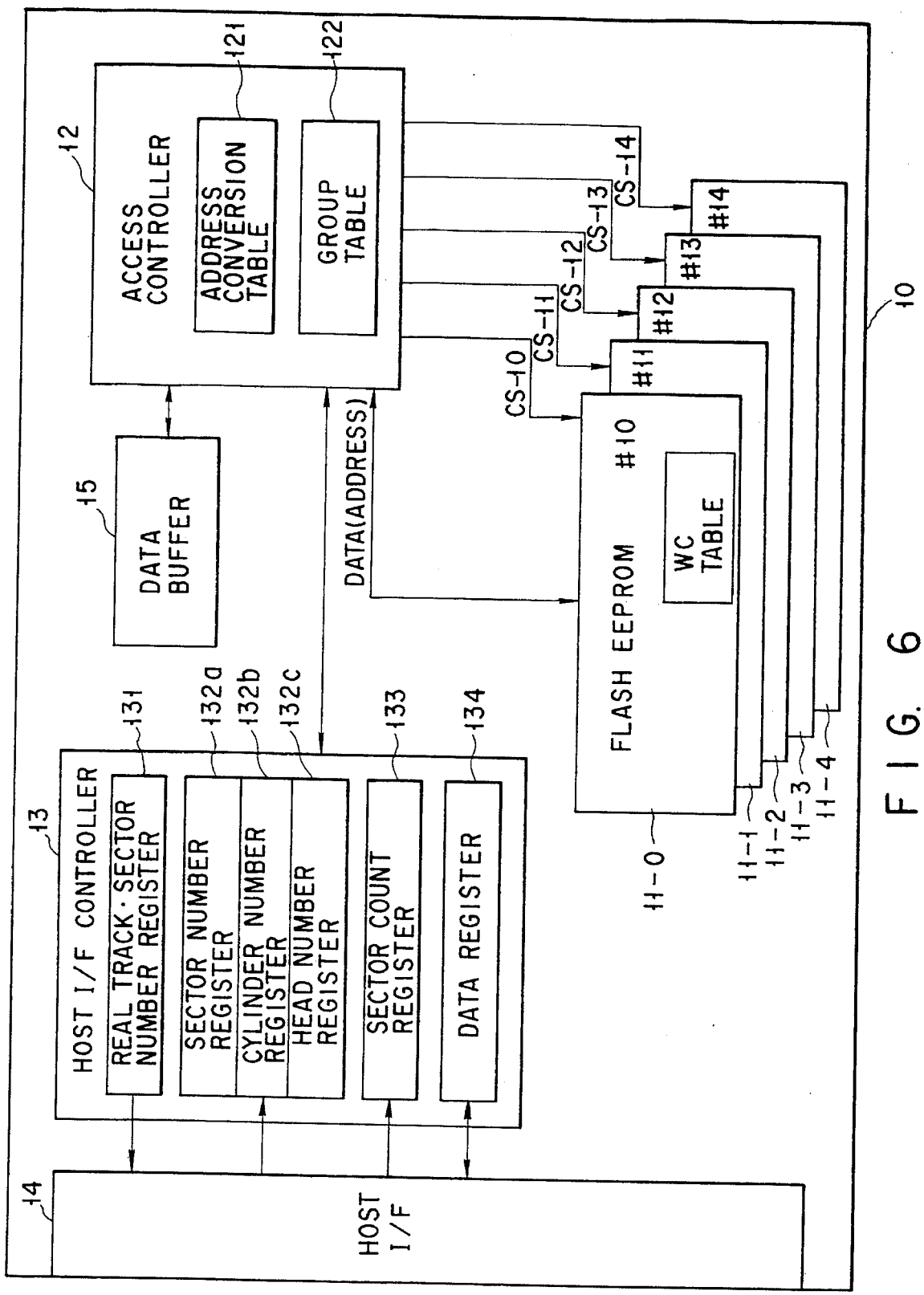
F I G. 6

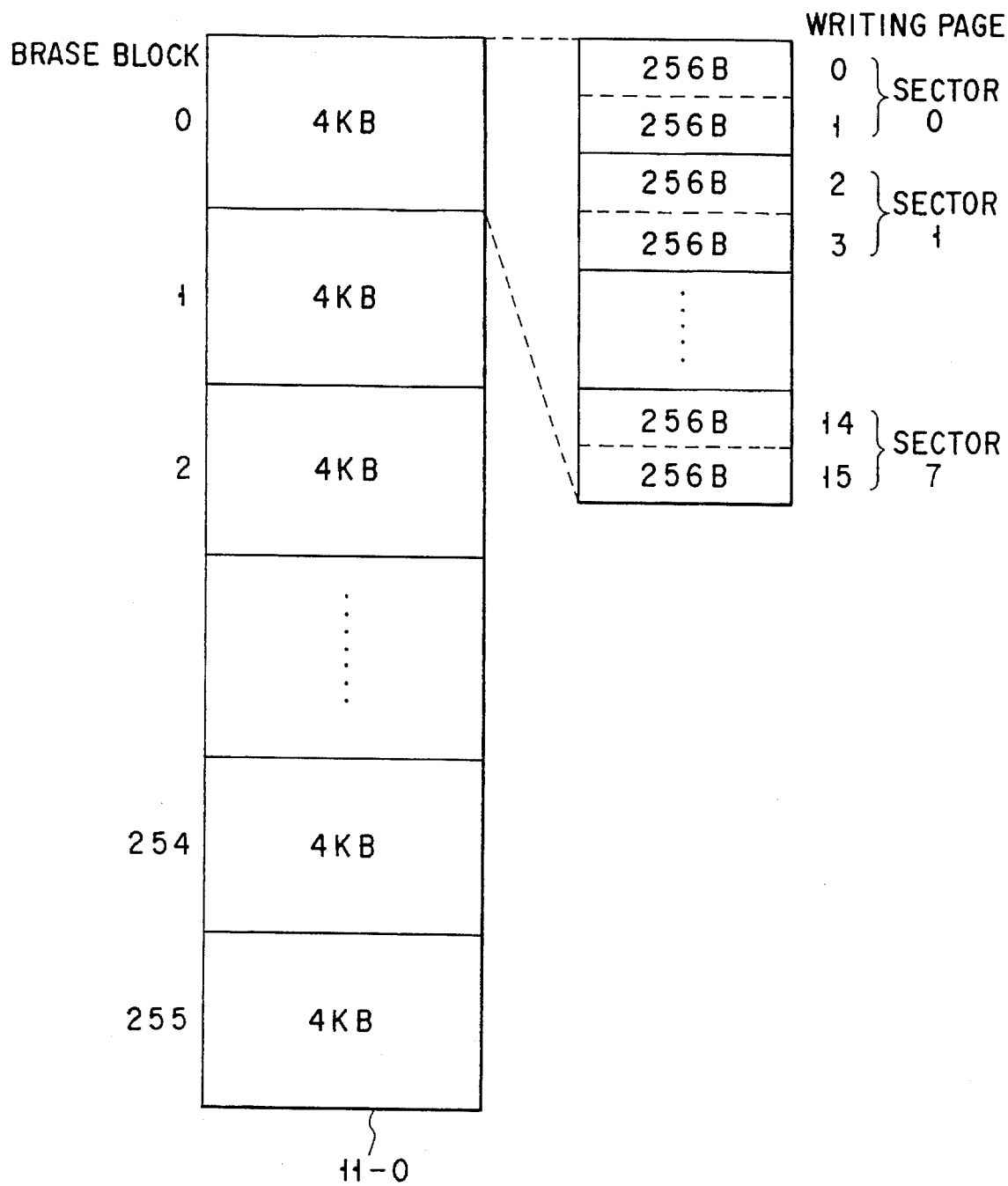
F I G. 8

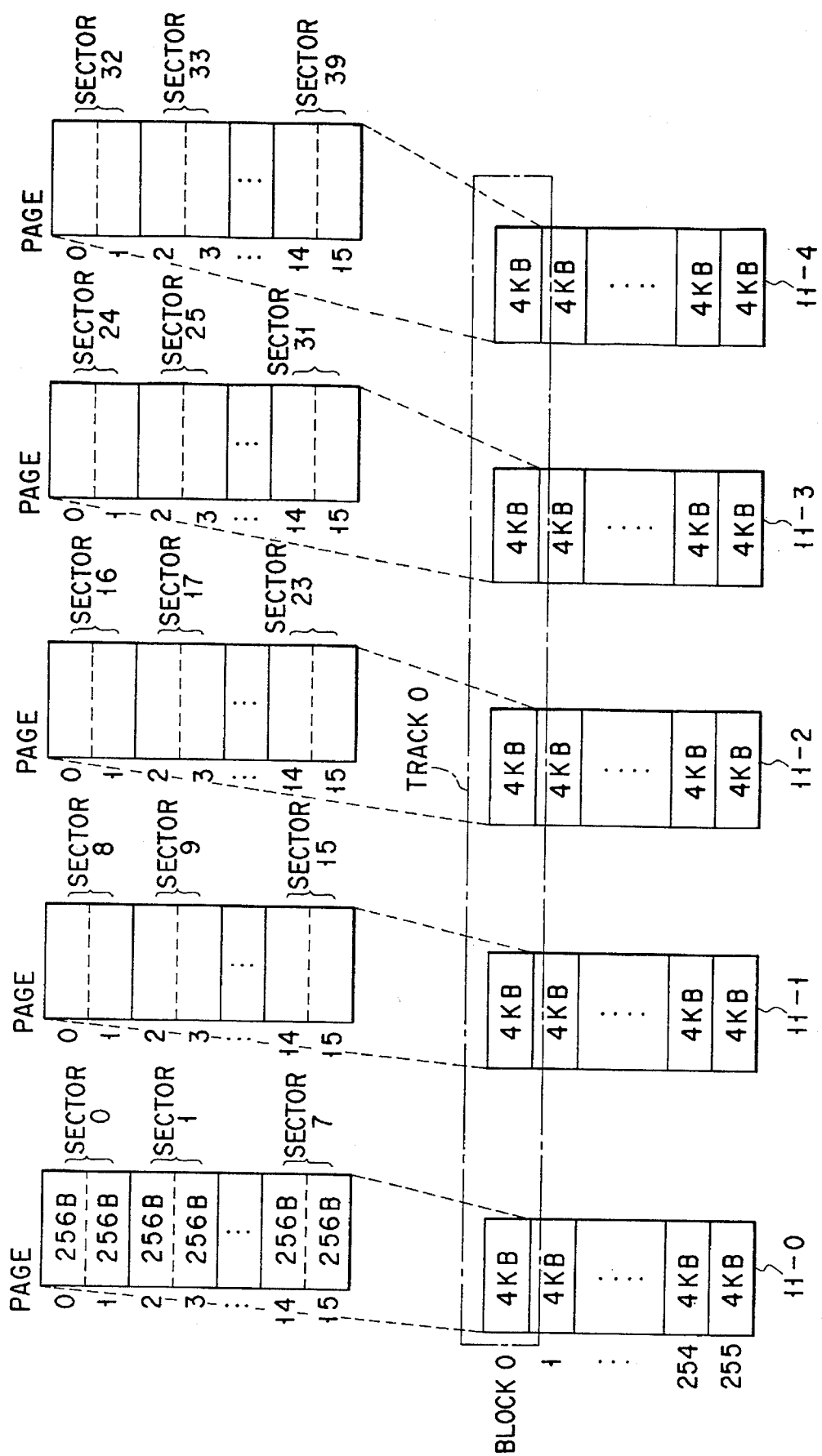
F I G. 9

ADDRESS CONVERSION TABLE 121

| LOGICAL ADDRESS | | REAL MEMORY ADDRESS | | |
|---|---|---|---|---|
| TRACK No. | SECTOR No. | CHIP No. | BLOCK No. | PAGE No. |
| 0 | 0 ↓ 7 | #10 ↓ | 0 | (0, 1) ↓ (14, 15) |
|   | 8 ↓ 15 | #11 ↓ |   | (0, 1) ↓ (14, 15) |
|   | 32 ↓ 39 | #14 ↓ |   | (0, 1) ↓ (14, 15) |
| 1 | 0 ↓ 7 | #10 ↓ | 1 | (0, 1) ↓ (14, 15) |
|   | 8 ↓ 15 | #11 ↓ |   | (0, 1) ↓ (14, 15) |
|   | 32 ↓ 39 | #14 ↓ |   | (0, 1) ↓ (14, 15) |
| 2 | 0 ↓ 7 | #10 ↓ | 3 | (0, 1) ↓ (14, 15) |
|   | 8 ↓ | #11 ↓ |   | (0, 1) ↓ |

F I G. 11

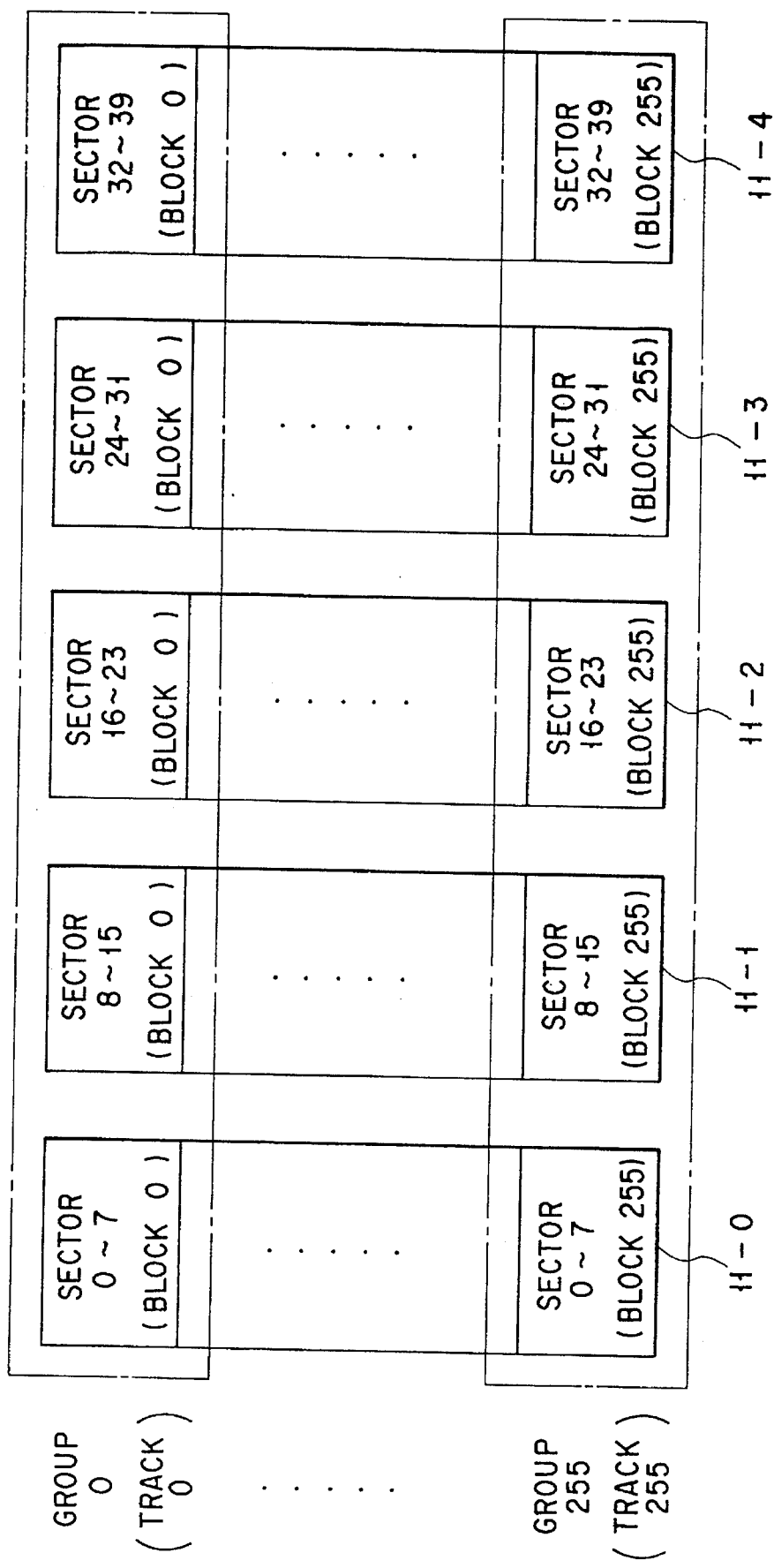
F I G. 15

FLASH MEMORY CHIPS

BACKGROUND OF THE INVENTION

1. Field of the Invention

The present invention relates to a semiconductor memory system equipped with a flash EEPROM (Electrically Erasable and Programable Read Only Memory) which is a non-volatile memory that is electrically and collectively erasable. More particularly, this invention relates to a semiconductor memory system that can employ an existing disk accessing scheme.

2. Description of the Related Art

Most conventional information processing system, such as a work station and a personal computer, use a magnetic disk drive as a memory device. The magnetic disk drive has advantages such as a high recording reliability and low bit price while having some short-comings such as its being large and susceptible to physical impact.

The operational principle of magnetic disk drives is to move a magnetic head on a rotating disk to write or read data on or from that disk. The mechanical moving portions, such as the rotatable disk and the magnetic head, may malfunction or may be damaged when a physical shock is applied to the disk drive. Further, the necessity of those mechanical movable portions gets in the way of making the whole drive compact.

To compensate for data when the aforementioned malfunction or damage occurs, conventionally, there is a technique of distributively storing data into a plurality of disk drives. This technique divides each word constituting data sent from a host system (computer main body) into predetermined bits and stores the data in the individual disk drives in that form. According to this technique, a spare disk drive for storing redundant or dummy data is provided to correct data even when one of a plurality of magnetic disk drives becomes entirely disabled.

As data is distributively stored into a plurality of disk drives to accomplish error correction according to this conventional technique, the length of one unit of data assigned to each disk drive is limited. According to this technique, after data is transferred to a magnetic disk drive, the transferred data is immediately recorded into a storage medium. To perform fast data reading/writing effectively using the performance of the magnetic disk drive, it is necessary to keep fast data transfer to the storage medium in a plurality of magnetic disk drives. Further, to read data from a plurality of disk drives, a buffer is necessary to restore a word that has been divided into predetermined bits.

Since magnetic disk drives require the mechanical movable portions as described above, it is difficult to make the entire disk drive compact. While such a magnetic disk drive will not raise any problem when used in a desktop computer which stays on a desk for usage, the aforementioned drawbacks become a bottleneck when it is used in a small portable laptop computer or notebook type computer.

Today, therefore, a lot of attention has been paid to a semiconductor disk drive which is small in size and is not susceptible to physical impact. Like the conventional magnetic disk drive, this semiconductor disk drive uses a flash EEPROM (Electrically Erasable and Programmable Read Only Memory), which is a non-volatile memory that is electrically and collectively erasable by the units of predetermined blocks, as a secondary memory device for a personal computer or the like. Like a DRAM (Dynamic Random Access Memory) and mask ROM (Read Only Memory) the flash EEPROM, which is also a semiconductor memory device, can achieve high density. As the semiconductor disk drive, unlike the magnetic disk drive, has no mechanical movable portions, it will not easily have a physical-impact oriented malfunction or damage. In addition, it has a smaller size which is advantageous.

Jpn. Pat. Appln. KOKAI Publication No. 4-57295, entitled "Electrically Programmable Memory Circuit," applied by NEC Corporation, discloses an example of a semiconductor disk drive which is designed to accomplish efficient data writing without wait using a plurality of semiconductor chips. The disclosed technique is designed to eliminate the wait time in one write cycle. This technology is targeted to an EEPROM as a semiconductor memory device. Normally, data is written byte by byte in an EEPROM in accordance with byte-by-byte data transfer. In a flash EEPROM, on the other hand, after data consisting of a predetermined number of consecutive bytes is transferred, it is written in the chips independently.

FIG. 1 illustrates an address which is sent to a semiconductor device (chip) from a host according to the technology by NEC Corporation. As shown in FIG. 1, predetermined bits of the address are used to control a CS (Chip Select) signal which selects one of a plurality of chips provided in the memory device. For instance, when four memory chips #0 to #3 are provided in the memory device as shown in FIG. 2, two bits in the logical address are used to control the CS signal. Those two bits are input to a predetermined decoder and is decoded into the CS signal there.

The upper and lower bits, excluding those two bits to control the CS signal, become a real memory address of that memory chip which become active by the CS signal. The number of the lower bits is enough to address the amount of data which can be written at a time, i.e., the amount of data which is written by the writing operation in one cycle. When 64-byte page writing is possible by the writing operation in one cycle for each of the memory chips #0 to #3, therefore, nine bits are assigned to the lower bits of the memory address so that 64 bytes can be addressed.

This bit assignment in the memory device provided with a plurality of memory chips can eliminate the wait time included in one writing cycle when data corresponding to consecutive addresses are written.

The continuous writing operation will now be described referring to FIGS. 2, 3A to 3E and 4A to 4D. Suppose that a semiconductor memory device is provided with the memory chips #0 to #3 as shown in FIG. 2, and those memory chips #0–#3 can each accomplish 64-byte page writing by one writing cycle. A write enable signal is output from the decoder to the memory chip #0 when predetermined two bits are "00," to the memory chip #1 when they are "01," the memory chip #2 when they are "10," and to the memory chip #3 when they are "11."

First, in writing data at consecutive address ("00000000000000000" to "0000010011111111111") shown in FIGS. 3A–3E, as the predetermined bits in the data corresponding to the address shown in FIG. 3A are "00," the data is stored on one page (page A; see FIG. 2) corresponding to the address ("000000000000000" to "000000111111111") in the memory chip #0. Likewise, the data corresponding to the addresses shown in FIGS. 3B to 3D are stored in the areas which correspond to the address ("000000000000000" to "000000111111111") in the respective memory chips #1 to #3 (pages B–D; see FIG. 2). As the predetermined bits in the data corresponding to the address shown in FIG. 3E are "00," the data is stored on page E (see FIG. 2) corresponding to the addresses ("000001000000000" to "000001111111111") again in the memory chip #0.

The target memory chip for data writing therefore changes page by page in the order of #0, #1, #2, #3 and #0 again as shown in FIG. 2. Accordingly, the wait time becomes as shown in the timing charts given in FIGS. 4A to 4D; it is apparent that the wait time included in one writing cycle can be eliminated.

Since this scheme produces a CS signal by decoding predetermined bits in the address sent from a host, the addresses in each memory chip should be fixed in a consecutive order. If a specific area (block) becomes disabled due to deterioration or the like, therefore, data cannot be written at consecutive addresses including the address which corresponds to that area.

Suppose page B in the memory chip #1 shown in FIG. 2 is damaged and unaccessible. Then, since the addresses corresponding to the areas of pages A to E (the addresses sent from a host) are fixed and consecutive, page F cannot be used for the lost page B. It is apparent that while the scheme taught by NEC Corporation can eliminate the wait time included in one writing cycle, it cannot flexibly cope with a damage or the like of a memory area (block) which may be caused by deterioration or the like.

There is a so-called swapping process which is designed to cope with damaged blocks in a flash EEPROM which are originated from the frequent erasing/writing action or the like. This swapping process prevents the concentration of rewriting to a specific block in a flash EEPROM, whose rewrite count is limited, at the time data is written. In addition, the swapping processes is executed only in each flash EEPROM chip.

The swapping processes will be briefly described with reference to the flowchart illustrated in FIG. 5. The details of the swapping process are described in U.S. patent application Ser. No. 001,750.

To execute a swapping process, a memory area for storing data of the rewrite count is provided block by block in a flash EEPROM chip. This rewrite count data is incremented every time the accessed block is rewritten. In addition to the memory area for the rewrite count data, an area for storing the upper data (upper bits) of the rewrite count data of each block is provided. The upper data to be stored in this area is updated when a predetermined carry of the rewrite count (renewal of predetermined upper bits) occurs, and will not be updated every time a normal rewriting action is taken.

When a writing access to a designated address is requested under the above conditions, the block which corresponds to this designated address is accessed (steps A1 and A3). Then, the rewrite count data stored in the accessed block is incremented after which it is determined if a predetermined carry has occurred (steps A5 and A7).

When a predetermined carry occurs (YES in steps A7), it is determined if a swapping process should be performed, referring to the upper data of the rewrite count data (step A9). This decision on the swapping process is performed for example by comparing the upper data of the accessed block with the upper data of other blocks and detecting that block whose rewrite count is less by more than a predetermined number than the rewrite count of the accessed block. Consequently, the block whose rewire count is less by more than a predetermined number than the rewire count of the accessed block is selected and the execution of the swapping process is determined. Then, data to be written in the accessed block is replaced with the data that is held in the block selected in step A9 (step A11).

When data replacement is complete, a table which correlates the area for storing the upper data, the logical address and the real memory address with one another are changed (step A13).

When a predetermined carry has not occurred (No in step A7) or no block whose rewrite count is less by more than a predetermined number than the rewrite count of the accessed block has not been detected (NO in step A9), the swapping process will not be performed and the accessed block is entirely erased before the requested data is written there (step A15).

This swapping process prevents the concentration of rewriting to a specific block to thereby provide the average rewrite frequency for the individual blocks. It is therefore possible to prolong the service life of the individual blocks in a flash EEPROM whose rewrite counts are limited.

As mentioned above, the swapping of data is limited within each chip in this swapping process. While the rewriting frequencies of the individual block in each chip can be averaged, therefore, the average rewrite frequency cannot be provided for the individual chips provided in the semiconductor disk drive.

If a semiconductor disk drive using a flash EEPROM is used as a spare disk, the logical address sent from a host system is converted into the real address in the semiconductor disk drive. Normally, a plurality of semiconductor chips are populated on a semiconductor disk drive. The above address conversion is executed by correlating the track number and sector number given by the logical address from the host system to the real memory address by which the flash EEPROMs in the semiconductor disk drive are selectively accessed.

There is no established scheme for determining how to correlate the track number and sector number given by the logical address from the host system with the internal real memory address.

With a semiconductor disk drive in use, therefore, the conventional disk accessing scheme in the host system which arranges consecutive data within the same track to suppress the frequency per track as much as possible cannot be used effectively. In other words, conventionally, the conventional disk access scheme of the host system cannot be employed, making it difficult to effectively use a semiconductor disk drive as a spare disk.

SUMMARY OF THE INVENTION

It is therefore a primary object of the present invention to provide a semiconductor memory system which is designed to permit parallel access to a plurality of flash EEPROMs when consecutive sector numbers in the same track are designated, so that the existing disk access scheme of a host system for limiting consecutive sectors to be accessed to the same track can be effectively used.

It is another object of this invention to provide a semiconductor memory system, which can give the averaged rewrite frequency for the individual flash EEPROM chips using a swapping process as well as can achieve the first object.

To achieve the foregoing objects, according to one aspect of this invention, there is provided a semiconductor memory system having a plurality of flash EEPROM chips, comprising: address converting means for converting a logical address designated by a host system by using a track number and a sector number, into a real memory address for accessing at least one of the plurality of flash EEPROM chips based on address conversion information, memory access means for performing a read/write access to the plurality of flash EEPROM chips in accordance with the real memory address converted from the logical address by the address converting means; and means for assigning sequential-sector number sets to sequential flash EEPROM chips so as to permit the memory access means to parallelly access the plurality of flash EEPROM chips, and for holding results of assigning the sequential-sector number sets as the address conversion information.

The system according to the aspect of this invention, further comprising: means for performing a swapping process for averaging numbers of a respective write operation of each memory area corresponding to one track number in a logical address.

According to another aspect of this invention, there is provided a method of controlling data stored in a semiconductor memory system connected to a host system and having a plurality of flash EEPROM chips, means for assigning sequential-sector number sets to sequential flash EEPROM chips so as to permit the memory access means to parallelly access the plurality of flash EEPROM chips, means for holding results of assigning the sequential-sector number sets as the address conversion information, means for performing a swapping process for uniforming a number of write operations each performed in units of blocks each having a predetermined size, and group information holding means for holding group information having real memory addresses corresponding to the sector numbers assigned to one track, the method comprising: a conversion step for converting a logical address designated by the host system by using a track number and a sector number, into a real memory address for accessing at least one of the plurality of flash EEPROM chips based on address conversion information; a memory access step of performing a read/write access to the plurality of flash EEPROM chips in accordance with the real memory address converted in the conversion step; and a step of determining, based on the group information held by the group information holding means, whether the swapping process should be performed on the blocks which belong to different chips.

With the above-described semiconductor memory system, consecutive sector numbers are allocated to flash EEPROM chips so as to cover the latter and the contents of the allocation are stored as address conversion information used for converting the logical address from the host system into the real memory address. This allows flash EEPROM chips to be accessed parallelly, when consecutive sector numbers in the same track are specified by the host system. Accordingly, by an existing disk accessing technique in the host system of arranging consecutively accessed sectors in the same track, the accessing speed of the semiconductor disk system can be improved, making possible effective use of the semiconductor disk system as an alternative disk unit.

Additionally, to achieve the swapping process inside and outside the memory chips, the correspondence between the logical address and the read addresses in the address conversion information only has to be rewritten, enabling the use of an existing disk accessing method. With the above-described semiconductor memory system, it is possible to execute a swapping process in units of chips.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention, in which:

FIGS. 3A to 3E show an address per page sent from the host system, respectively, all the addresses shown in FIGS. 3A to 3E being consecutive;

FIGS. 4A to 4D are timing charts for the write operation according to the consecutive addresses shown in FIGS. 3A to 3E, and correspond to memory chips #0 to #3, respectively;

FIG. 6 is a block diagram of a semiconductor disk drive according to an embodiment of the present invention;

FIG. 8 is an illustration for explaining an example of data write unit/erase unit in the flash EEPROM chips provided in the semiconductor disk drive of the embodiment;

FIG. 9 is an illustration for describing a concrete example of allocating addresses to the flash EEPROMs provided in the semiconductor disk drive of the embodiment;

FIG. 11 shows an example of the structure of an address conversion table provided in the semiconductor disk drive of the embodiment;

FIG. 15 is an illustration for describing allocating groups in executing the swapping process between the flash EEPROM chips of the embodiment;

DETAILED DESCRIPTION OF THE PREFERRED EMBODIMENTS

Figure 1:
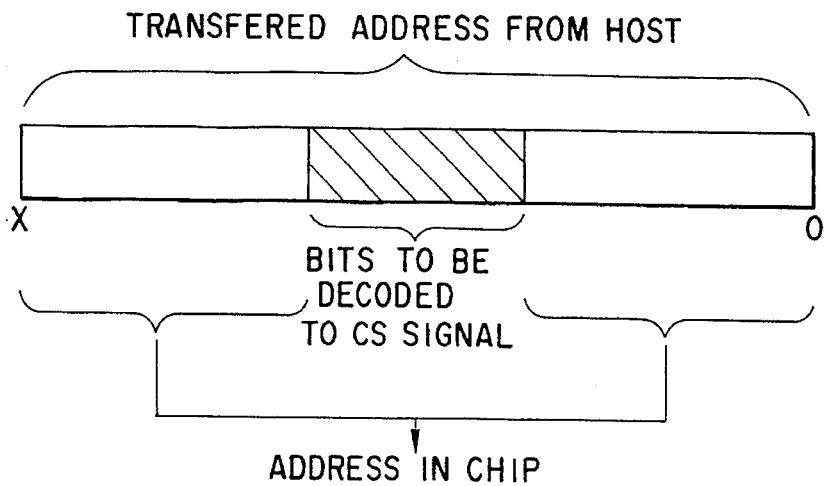
FIG. 1 is a pictorial diagram of the structure of an address sent from the host system in a memory device using EEPROMs.
Figure 2:
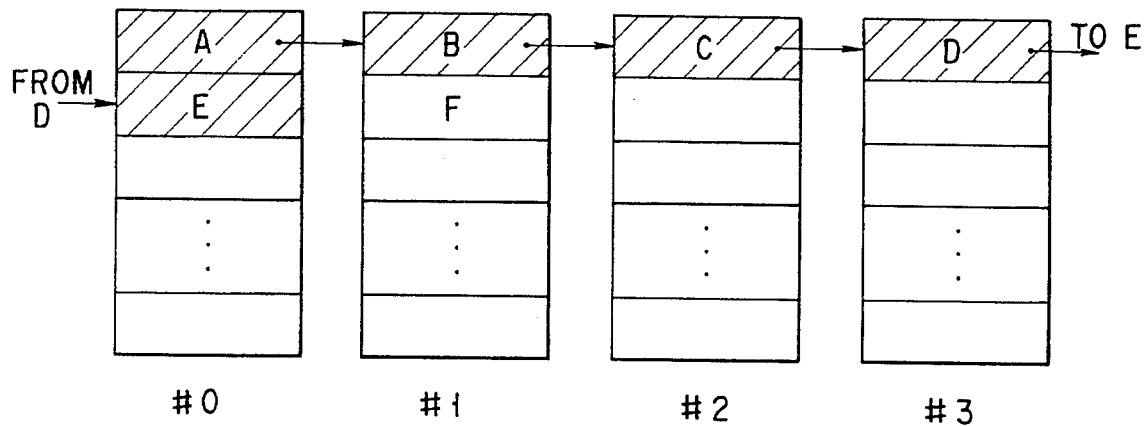
FIG. 2 shows the arrangement of the individual EEPROM chips for explaining the continuous write operations in the memory device.
Figure 5:
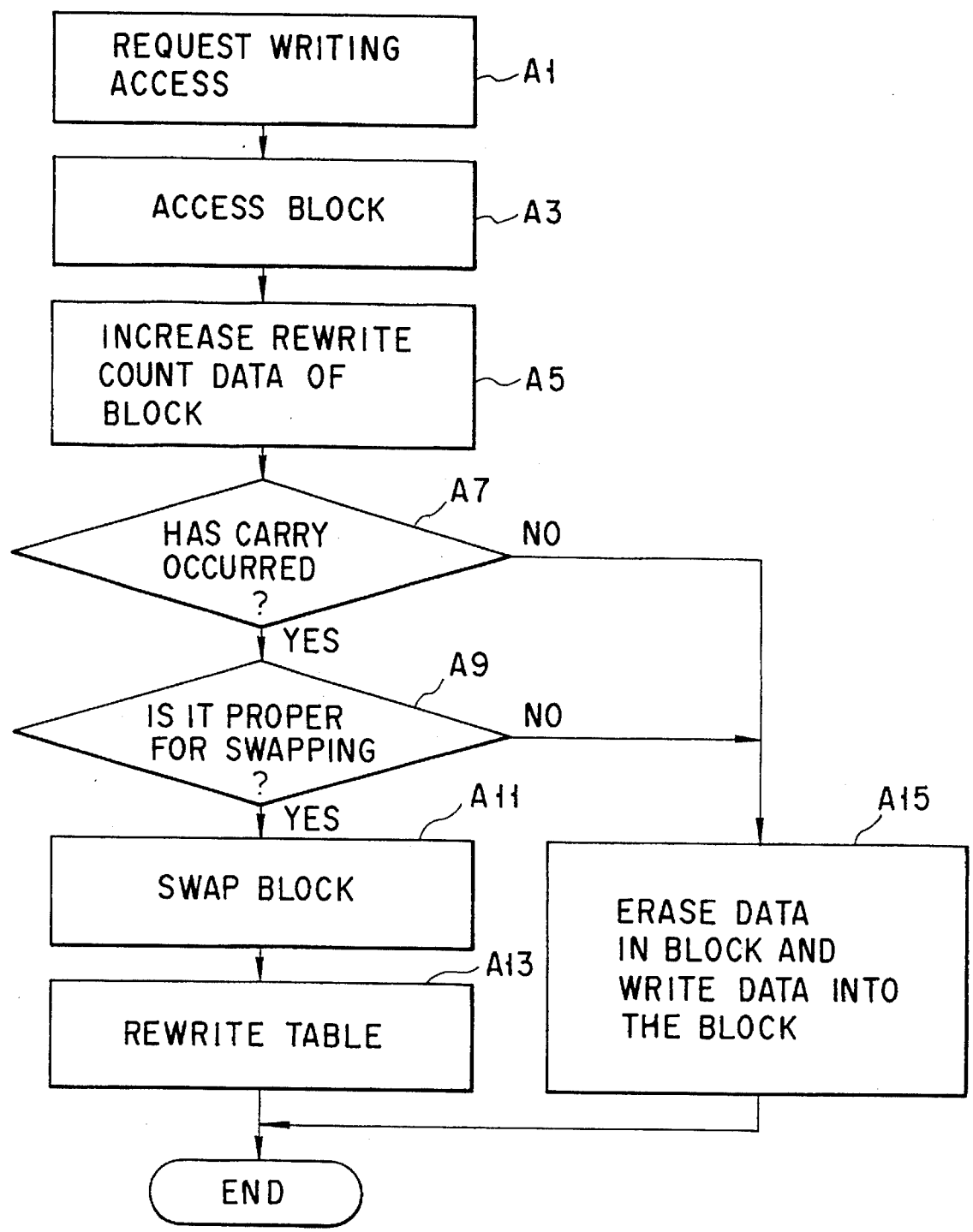
FIG. 5 is a flowchart for explaining the swapping process in a flash EEPROM.

Hereinafter, an embodiment of the present invention will be described with reference to the accompanying drawings.

FIG. 6 shows the structure of a semiconductor disk drive according to an embodiment of the present invention. The semiconductor disk drive 10 is used as a secondary memory for a personal computer in place of a hard disk drive or a floppy disk drive, and has a PCMCIA (Personal Computer Memory Card International Association) interface or an IDE (Integrated Drive Electronics) interface, for example. The semiconductor disk drive 10 is provided with flash EEPROM chips 11-0 through 11-4 as data storage elements. In these flash EEPROM chips 11-0 through 11-4, the minimum unit of data amount handled in a write or an erase operation is determined and the unit amount of data will be handled in unison. Here, as an example, it is assumed that the flash EEPROM chips 11-0 through 11-4 allow data write in pages of 256 bytes and data erase in blocks of 4K bytes. In this case, for these flash EEPROMs, it is preferable to use Toshiba's 16M-bit NAND flash EEPROMs. Each of the flash EEPROMs 11-0 through 11-4 is provided with a WC (write count) table explained later, so that the number of writes in each block more than a predetermined value may be stored in one block of a memory area.

The semiconductor disk drive 10 comprises an access controller 12, a host interface controller 13, a host interface 14, and a data buffer 15. The access controller 12 provides access control of the flash EEPROM chips 11-0 through 11-4 via the host interface 14 and the host interface controller 13, in response to an disk access request supplied from a host CPU.

This access can be achieved by a command method where an operation mode of the flash EEPROM chips is specified by a command. Specifically, the access controller 12 first specifies an operation mode (write, read, erase, verify, etc.) of the flash EEPROM chips and then supplies an address (an address and the write data in the case of the write mode) indicating an access position to the flash EEPROM chips. Each flash EEPROM chip is provided with, for example, a 256-byte input/output register. Thus, for example, in the write mode, after the write data has been transferred to the register by the access controller 12, a write operation is carried out inside the flash EEPROM chips. As a result, the access controller 12 is freed from the write access control.

The access controller 12 is provided with an address conversion table 121 and a group table 122. In the address conversion table 121, the correspondence between the logical addresses (the track numbers and the sector numbers) from the host CPU and the real addresses for accessing the flash EEPROM chips 11-0 through 11-4 is defined. In this case, the consecutive sector numbers in the same track are arranged so as to cover the flash EEPROM chips 11-0 through 11-4. In the group table 122, a block of each flash EEPROM chip corresponding to one track is defined as a group.

The host interface 14, like a hard disk drive connectable to a host system bus, has, for example, a 40-pin arrangement conforming with the IDE interface, or like an IC card installable in an IC card slot, has, for example, a 68-pin arrangement conforming with the PCMCIA interface.

The host interface controller 13, which is used as an interface between the host interface 14 and the access controller 12, comprises a real track.sector number register 131, a register 13 representing the access start position, a sector count register 133, and a data register 134. These registers can be read from and written into by the host CPU. The register 132 is composed of a sector number register 132a, a cylinder number register 132b, and a head number register 132c.

The real track.sector number register 131 holds the information indicating the number of sectors per track allocated to the flash EEPROM chips 11-0 through 11-4. This information is read by the host CPU. The access start position logical address specified by the host CPU is written into the access start position register 132. The data representing the data length specified by the host CPU is written into the data length register 133. The write data inputted from the host CPU or the read data outputted to the host CPU is set in the data register 134.

The data buffer 15 holds the write data sent from the host CPU or the read data from the flash memories 11-0 through 11-4. The access controller 12 selects flash EEPROMs 11-0 through 11-4 and reads and writes data from and into the selected flash EEPROM. In this case, the access controller 12 selectively supplies chip select signals CS-0 through CS-4 to the flash EEPROMs 11-0 through 11-4 in order to select the flash EEPROM corresponding to the memory chip number outputted from the address conversion table 121. The access controller 12 counts up the start address so that the data of the size generated with the memory address from the address conversion table 121 as the start address and sent from the host CPU may be read and written.

Figure 7:
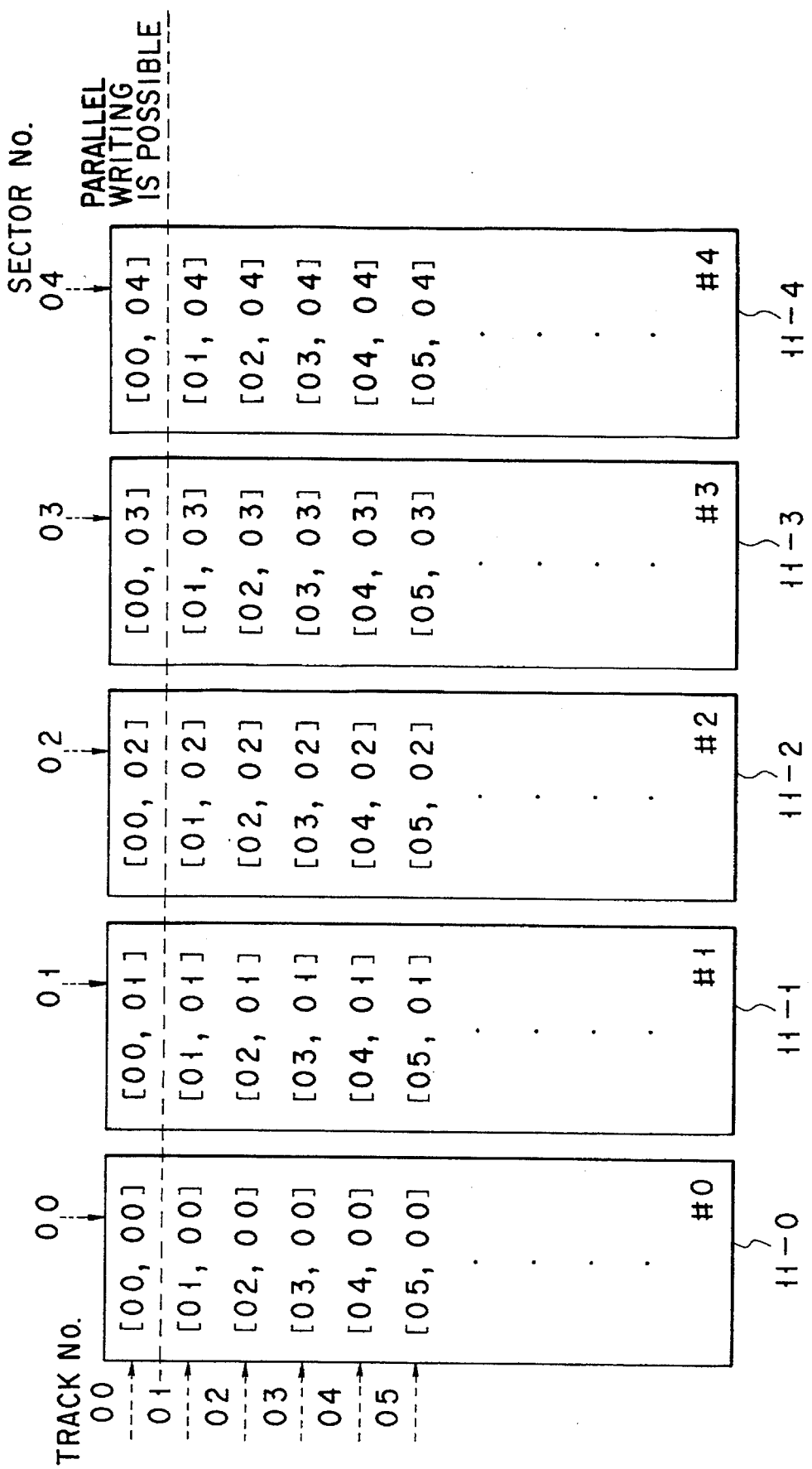
FIG. 7 is an illustration for explaining the principle of allocating addresses to flash EEPROM chips provided in the semiconductor disk drive of the embodiment.

Referring to FIG. 7, the principle of allocating addresses to the flash EEPROMs 11-0 through 11-4 will be described.

In FIG. 7, [] represents a write unit. In [], the numbers 00, 01, 02, 03, 04, 05, . . . on the left indicate track numbers viewed from the host CPU, and the numbers 00, 01, 02, 03, 04, . . . on the right indicate sector numbers viewed from the host CPU.

In this way, a write unit for the flash EEPROMs 11-0 through 11-4 is allocated consecutive sector numbers in the same track viewed from the host CPU so that the numbers may cover the flash EEPROMs 11-0 through 11-4. With this allocation, when the host CPU specifies a write operation for five consecutive sectors in the same track, the flash EEPROMs 11-0 through 11-4 are written into parallelly, enabling parallel write operation on the five sectors.

FIG. 8 shows a write unit and an erase unit for the flash EEPROM 11-0. As shown, the flash EEPROM 11-0 has an erase block size of 4K bytes and is designed to perform a write operation in pages of 256 bytes in each erase block of 4K bytes. Since the data size of a sector is usually 512 bytes, two pages form a sector in this embodiment. Also in this embodiment, it is assumed that the flash EEPROM 11-0 is a 16M-bit (4K bytes×256) memory chip.

With the flash EEPROM 11-0, for example, after a first erase block is erased once, a 256-byte unit of data can be written up to 16 times without any erase operation. That is, eight sectors of data can be written with no erase operation.

Next, referring to FIGS. 9 and 10, an example of actually allocating addresses to the flash EEPROMs 11-0 through 11-4 will be described, provided that all the flash EEPROMs 11-0 through 11-4 are constructed as shown in FIG. 8.

As shown in FIG. 9, the 4K bytes in the erase block of each of the flash EEPROMs 11-0 through 11-4 are allocated eight consecutive sectors. Then, the five corresponding erase blocks of the flash EEPROMs 11-0 through 11-4 form a track.

Figure 10:
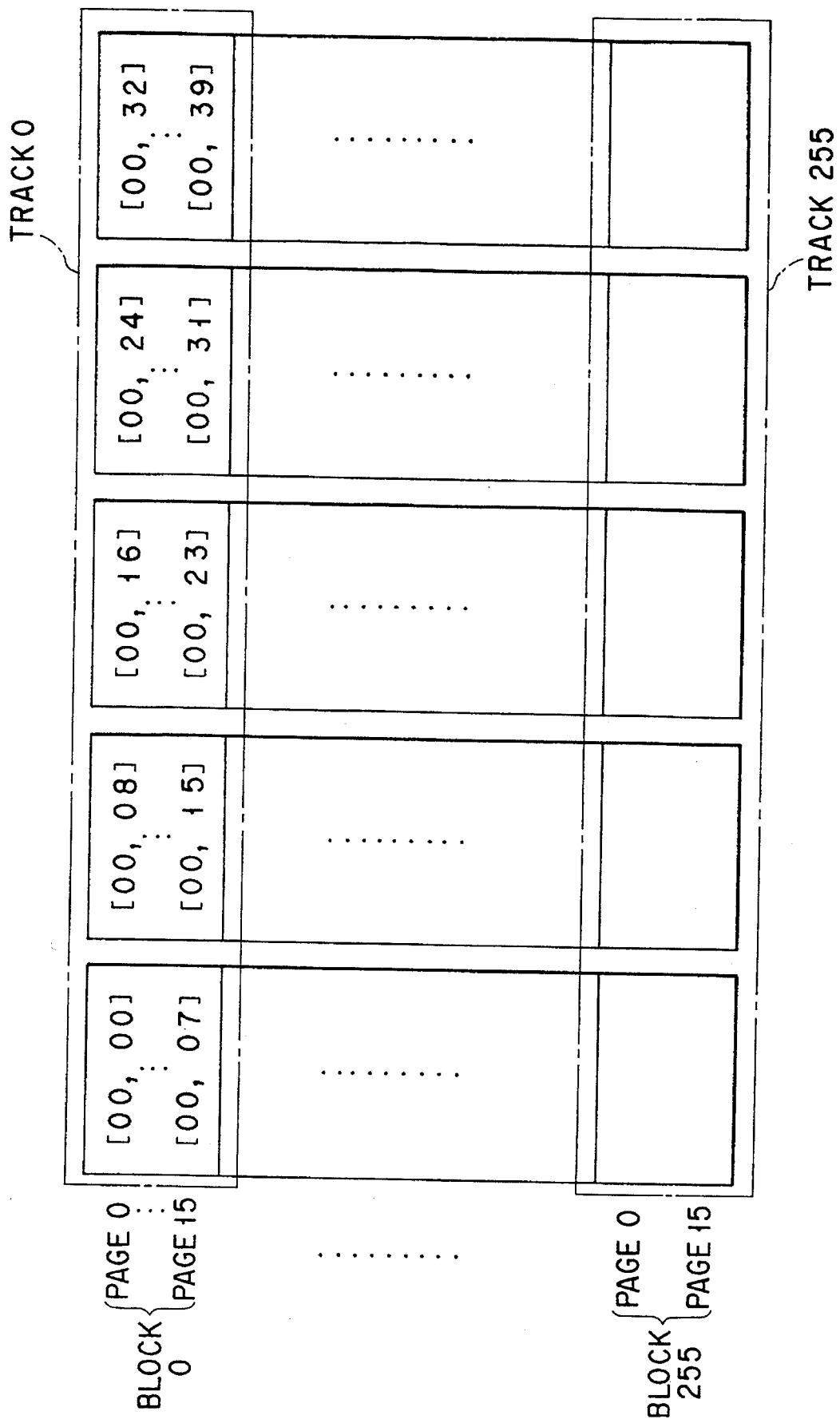
FIG. 10 is an illustration for describing a concrete example of allocating addresses to the flash EEPROMs provided in the semiconductor disk drive of the embodiment.

In this case, as seen from the FIG. 10, sector 0 through sector 7 in track 0 are allocated to the first erase block of the flash EEPROM 11-0, sector 8 through sector 15 in track 0 are allocated to the first erase block of the flash EEPROM 11-1, sector 16 through sector 23 in track 0 are allocated to the first erase block of the flash EEPROM 11-2, sector 24 through sector 31 in track 0 are allocated to the first erase block of the flash EEPROM 11-3, and sector 32 through sector 39 in track 0 are allocated to the first erase block of the flash EEPROM 11-4.

In this allocation, the number of sectors per track is 40 and a track contains 20K bytes (512 bytes×40).

FIG. 11 shows an example of the structure of the address conversion circuit table 121 after such address allocation has been effected.

As shown in FIG. 11, in the conversion table 121, the correspondence between the logical addresses (track numbers and sector numbers) specified by the host CPU and the real memory addresses (chip numbers, block 10 numbers, and page numbers) for accessing the flash EEPROMs 11-0 through 11-4 is defined. Chip No. #10 indicates flash EEPROM 11-0, chip No. #11 represents flash EEPROM 11-1, and chip No. #14 denotes flash EEPROM 11-4.

With the conversion table 121, for example, when sector 0 in track 0 is specified by the host CPU, the access controller 12 sets chip select signal CS-0 corresponding to flash EEPROM 11-0 in the active state. This makes the flash EEPROM 11-0 accessible, and page 0 and page 1 in block 0 of the flash EEPROM 11-0 undergo read or write access. Similarly, when sector 32 in track 0 is specified by the host CPU, the access controller 12 sets chip select signal CS-4 corresponding to flash EEPROM 11-4 in the active state. This makes the flash EEPROM 11-4 accessible, and page 0 and page 1 in block 0 of the flash EEPROM 11-4 undergo read or write access.

Figure 12:
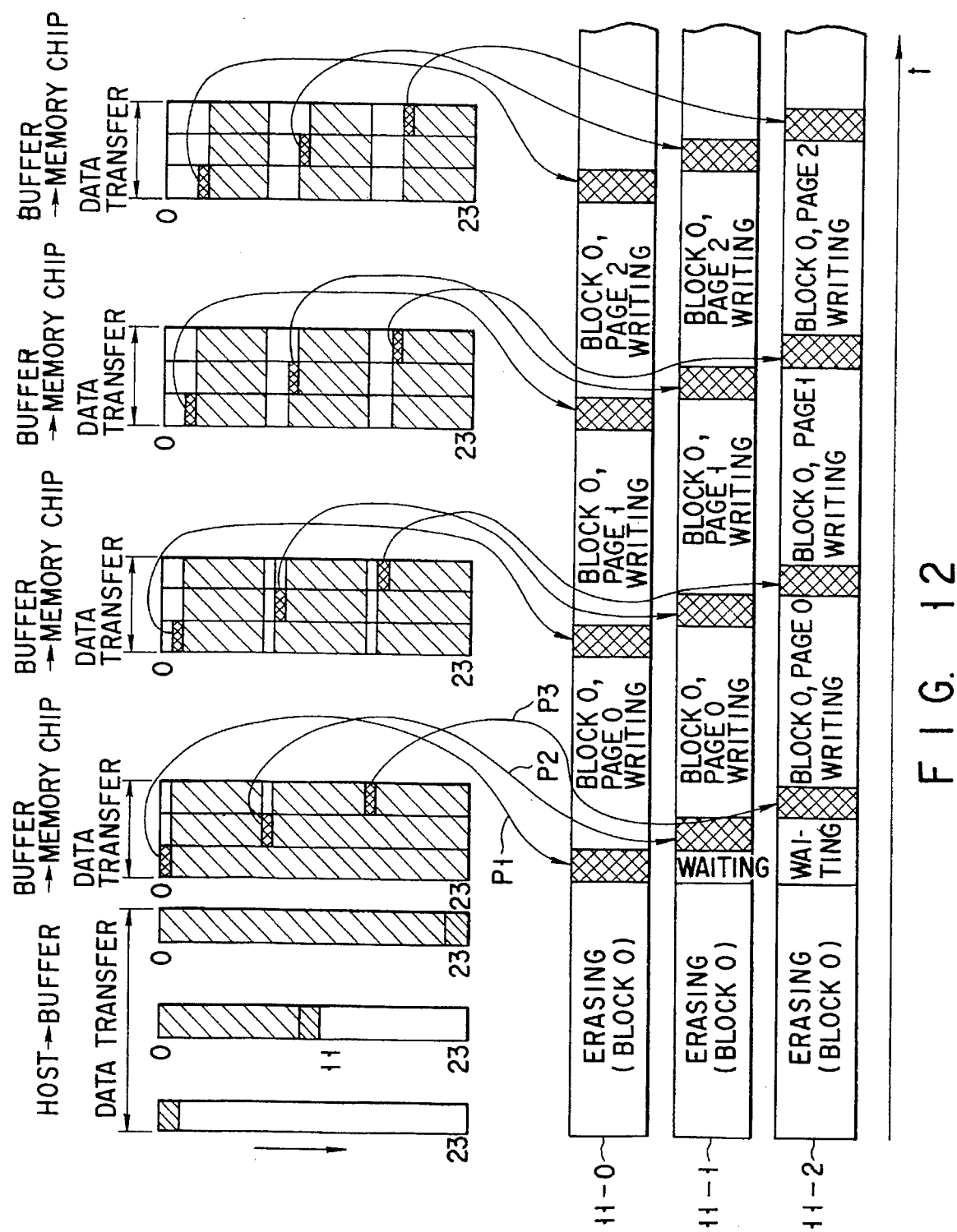
FIG. 12 is an illustration for explaining the data write operation in the semiconductor disk drive of the embodiment.

The data write operation in the semiconductor disk drive 10 will be described with reference to FIG. 12.

It is assumed that the host CPU specifies sector 0 in track 0 as the access start position and the data size is 12K bytes. In this case, sector 0 to sector 23 in track 0 are to undergo write access. Sector 0 in track 0 corresponds to page 0 and page 1 in block 0 of flash EEPROM chip 11-0 and sector 23 in track 0 corresponds to page 14 and page 15 in block 0 of flash EEPROM chip 11-2. Therefore, block 0 in each of the flash EEPROM chips 11-0 through 11-2 is to undergo write access.

First, the host CPU transfers 12K bytes (24 sectors) of data to the data buffer 15 via the access controller 12. During this transfer period, block 0 in each of flash EEPROM chips 11-0 through 11-2 is erased.

Then, the access controller 12 transfers the first 256 bytes of data (the first half of data in sector 0) stored in the data buffer 15 to the register in flash EEPROM chip 11-0 (P1). Then, flash EEPROM chip 11-0 operates in the write mode to write data into page 0 in block 0. During the write operation in the flash EEPROM chip 11-0, the access controller 12 need not control chip 11-0.

Therefore, after having transferred data to flash EEPROM chip 11-0, the access controller 12 begins to transfer data to flash EEPROM chip 11-1. In this case, because page 0 in block 0 of flash EEPROM chip 11-1 corresponds to the first half of sector 8, the half of the data in sector 8 is transferred by the access controller 12 to the register in flash EEPROM chip 11-1 (P2). Then, flash EEPROM chip 11-1 operates in the write mode to write data into page 0 in block 0. Also during the write operation in the flash EEPROM chip 11-1, the access controller 12 need not control chip 11-1.

Then, after having transferred data to flash EEPROM chip 11-1, the access controller 12 begins to transfer data to flash EEPROM chip 11-2. In this case, because page 0 in block 0 of flash EEPROM chip 11-2 corresponds to the first half of sector 16, the half of data in sector 16 is transferred by the access controller 12 to the register in flash EEPROM chip 11-2 (P3). Then, flash EEPROM chip 11-2 operates in the write mode to write data into page 0 in block 0.

Next, after flash EEPROM chip 11-0 has been written into, the access controller 12 transfers the remaining half of data in sector 0 to the register in flash EEPROM chip 11-0.

In this way, data transfer to flash EEPROM chips 11-0 through 11-2 and the writing of data into flash EEPROM chips 11-0 through 11-2 are practically performed simultaneously.

As described above, in this embodiment, consecutive sector numbers are allocated to flash EEPROM chips 11-0 through 11-4 so as to cover the latter, and the contents of the allocation are stored in the address conversion table 121 as the address conversion information for converting the logical address from the host CPU into the real memory address. Thus, when the host CPU specifies consecutive numbers in the same track, flash EEPROMs are accessed parallelly. As a result, by an existing disk accessing technique in the host system of arranging consecutively accessed sectors in the same track, the accessing speed of the semiconductor disk drive 10 can be improved, making possible effective use of the semiconductor disk device as an alternative disk unit.

Further, the number of sectors per track determined by the above-described address allocation is stored in the real track.sector number register 131. Because the host CPU reads the information in the real track.sector number register 131, the host CPU can specify access in a suitable manner for the arrangement of the semiconductor disk drive 10.

Further, in the above-described address allocation definition, a swapping process can be applied as follows.

Figures 13, 14:
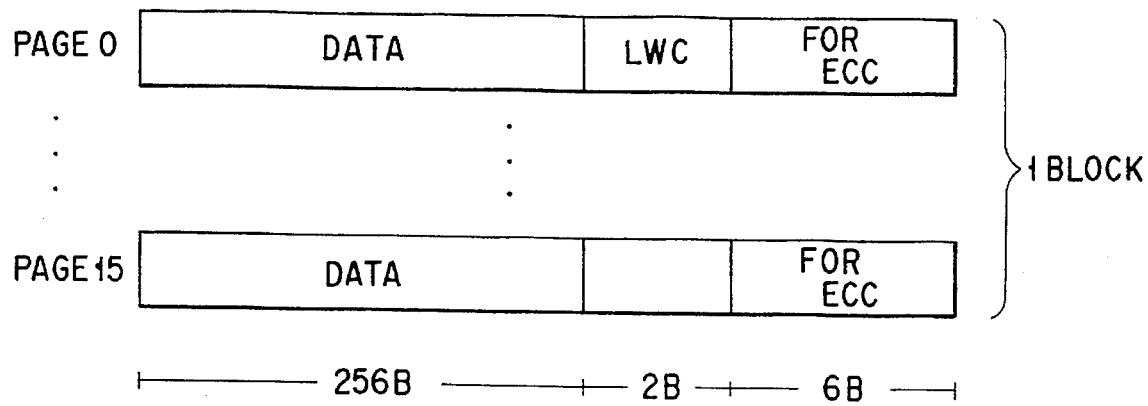
FIG. 13 is a block diagram of a schematic structure of each page constituting blocks of the flash EEPROM chips of the embodiment.
FIG. 14 is an illustration of a write count table provided in the flash EEPROM chips of the embodiment.

A schematic structure of a block in flash EEPROM chips 11-0 through 11-4 is shown in FIG. 13. As noted earlier, a block is composed of a page×16. Each page has an extra memory area of 8 bytes as well as a data memory area of 256 bytes. Of the 8 bytes in the extra memory area, 6 bytes are used for ECC (error checking and correcting). Only for the first page (page 0) of each block, the remaining two bytes in the 8 bytes in the memory area are an area for counting the number of writes. Here, it is particularly called an LWC (lower write counter). Each time a block is written into, the LWC is incremented.

As shown in FIG. 14, the write count table provided in each flash EEPROM chip stores the block number in the chip and the high-order 7 bits in the LWC corresponding to the block number are stored. By storing the high-order 7 bits, 1K (1024) writes can be sensed in the corresponding block.

Further, groups are defined as shown in FIG. 15. This group definition is stored in the group table 122 in the access controller 12 using the real memory address. For example, as shown in FIG. 15, group 0 is defined as track 0, that is, block 0 in each of flash EEPROM chips 11-0 through 11-4. Similarly, group 1 to group 255 are defined in the group table 122.

Figure 16:
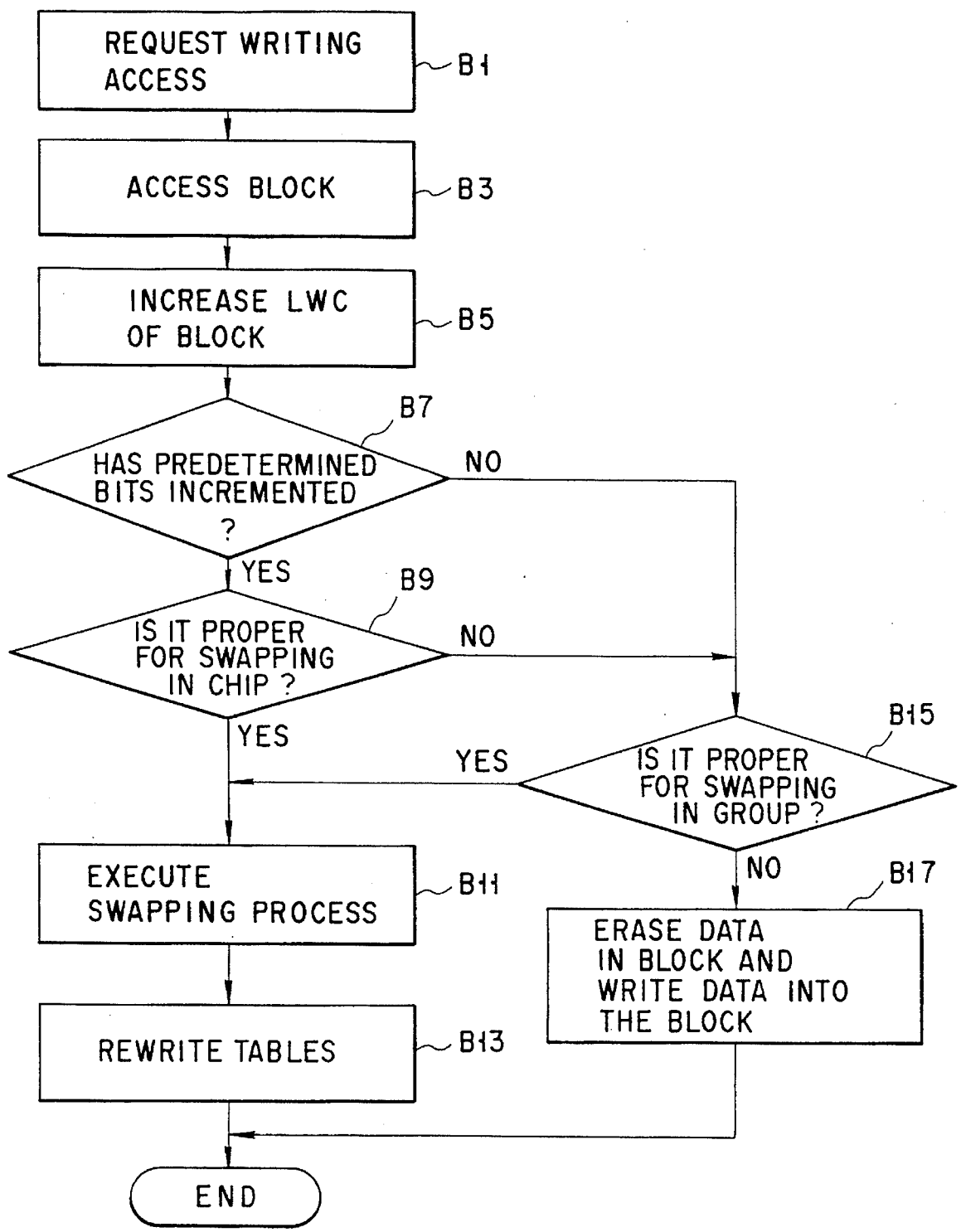
FIG. 16 is a flowchart for explaining the swapping process of the embodiment.

Under such conditions, according to the flowchart shown in FIG. 16, a swapping process is executed. The swapping process is performed on the basis of the following two rules:

(1) When the swapping process is executed between different memory chips, the swapping process between only blocks in the groups defined in the group table 122 is allowed to be executed.

(2) When the swapping process is executed between blocks in the same memory, the real memory address is updated in the group table 122 in such a manner that the group settings in logical addresses are not changed.

When a write access request for a specified address (logical address) occurs, the block corresponding to the specified address is accessed on the basis of the address conversion table 121 (steps B1 and B3). The data in the LWC of the accessed block is incremented, and it is judged whether or not the data represented by specified high-order bits (the high-order 7 bits in this embodiment) is incremented (steps B5 and A7).

When the high-order 7 bits of data in the LWC is incremented (YES in step B7), the corresponding counter in the write count table in the chip having the block accessed is incremented. Further, referring to the write count table, it is judged whether the swapping process should be executed or not (step B9). This swapping judgment is made by, for example, judging whether or not among the count data in the write count table, there is a block whose count data is less than the incremented count by a specified value or more. When such a block is sensed (YES in step B9), the swapping process between the sensed block and the accessed block is carried out (step B11).

After the data has been swapped, the LWC in the block sensed is incremented, and the address conversion table 121 and the group table 122 are updated according to the real memory addresses of the accessed block and the sensed block (step B13).

When the specified bits have not been incremented (NO in step B7) or when a block whose count data is less than the count data in the accessed data by a specified value or more is not sensed (NO in step B9), the group table 122 is first referred to. Here, the real memory addresses of the other blocks in the group to which the accessed block belongs are retrieved, and on the basis of the retrieved real memory addresses, the count for each block (the specified high-order bits) is sensed. Then, it is judged whether or not in the group to which the accessed block belongs, there is a block whose count is less than the count for the accessed block by a specified value or more (step B15). The specified value is different from the specified value in the step B9.

When in the block to which the accessed block belongs, a block whose count is less than the count for the accessed block by a specified value or more is sensed (YES in step B15), the swapping process is performed between the sensed block and the accessed block (step B11). After this, on the basis of the real memory address of each block, the address conversion table 121 is updated (step B13).

When in the block to which the accessed block belongs, a block whose count is less than the count for the accessed block by a specified value or more is not sensed (No in step B15), the swapping process is not performed. After the blocks accessed are erased in unison, the data to be written is written (step B17).

By the above processes, the swapping process when a write request is issued is judged and performed in the embodiment.

Figure 17A:
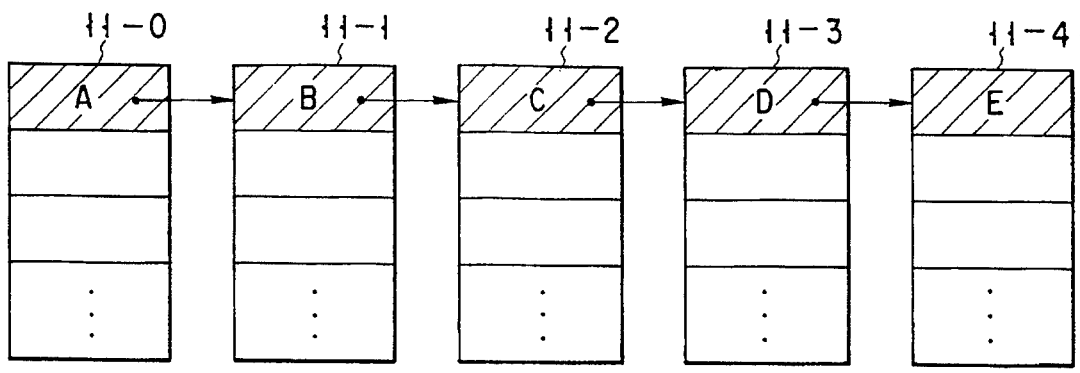
FIGS. 17A to 17C are illustrations for describing blocks in which the data to be changed by the swapping process of the embodiment is stored.

By effecting the swapping process according to the flowchart shown in FIG. 16, data exchange in blocks can be achieved as explained below. For example, it is assumed that as shown in FIG. 17A, data items A through E are written into flash EEPROM chips 11-0 through 11-4 according to consecutive logical addresses. As described earlier, data items A through E can be written into each of flash EEPROM chips 11-0 through 11-4 by an existing disk accessing method.

Figure 17B:
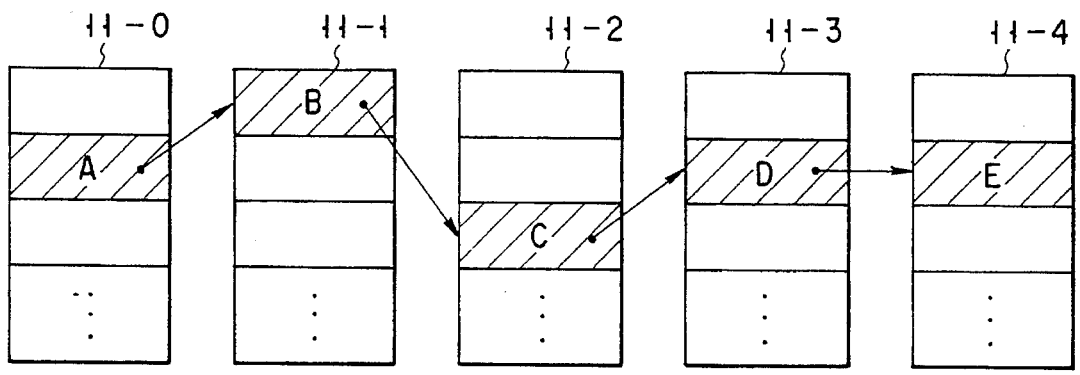

A case where the swapping process is performed in a chip according to the flowchart of FIG. 16 is shown in FIG. 17B.

As a result of the swapping process, data items A through E except for B are written into different blocks in the chip from the original blocks. Only the correspondence between the logical addresses and the real memory addresses in the address conversion table 121 is rewritten. Data items A through E, however, correspond to consecutive logical addresses as in the first write operation. Therefore, by performing the swapping process, an existing disk accessing method can be applied to data items A through E, even if blocks into which data items A through E are stored are such as shown in FIG. 17B.

Figure 17C:
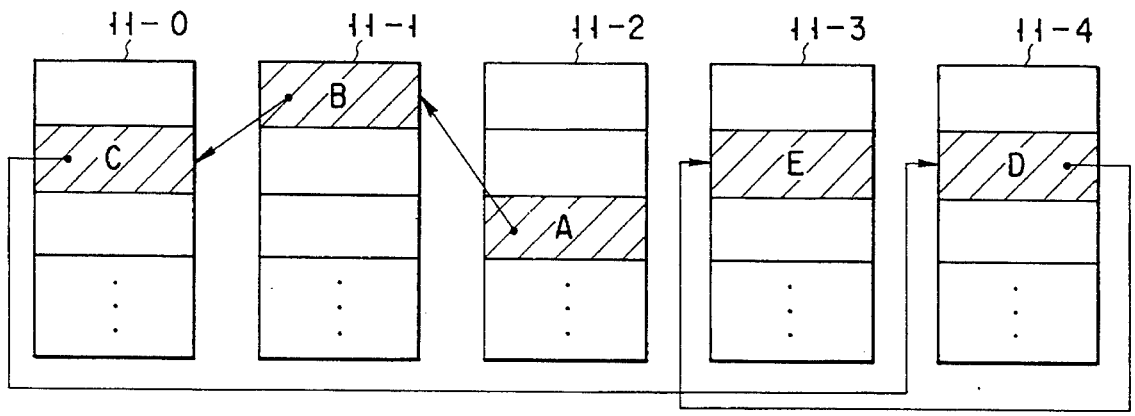

Further, a case where the swapping process is performed between flash EEPROM chips is shown in FIG. 17C. This is the result of executing the swapping process between blocks into which data item A and data item B are stored respectively, and between blocks into which data item E and data item D are stored respectively. As in FIG. 17B, only the correspondence between the logical addresses and the real memory addresses in the address conversion table 121 is rewritten. Data items A through E, however, correspond to consecutive logical addresses as in the first write operation. In addition, data items A through E are stored in flash EEPROM chips so as to cover the latter; they are not stored in the same chip in a stacked manner. Therefore, even if the stored state of data items A through E is as shown in FIG. 17C, an existing disk accessing method can be applied to data items A through E.

In this embodiment, the swapping process in units of blocks is executed. By comparing a total write count of this chips one another, a swapping process in units of chips can be executed.

A capacity of every chip in this embodiment is uniform. However, the capacity of each chip may be different from one another.

As described in detail, with the present invention, because flash EEPROMs can be accessed parallelly when consecutive sector numbers in the same track are specified, an existing disk accessing technique in the host system of arranging consecutively accessed sectors in the same track can be used effectively. Additionally, to achieve the swapping process inside and outside the memory chips, the correspondence between the logical addresses and the real memory addresses in the address conversion table only has to be rewritten, enabling the use of an existing disk accessing method.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory system having a plurality of flash EEPROM chips each having a function of write processing in response to a control signal, each memory area of said plurality of flash EEPROM chips being divided into a plurality of erasure blocks, said semiconductor memory system comprising:

assigning means for assigning sequential sector number sets to said plurality of erasure blocks so as to permit the sequential sector number sets to be sequentially assigned to said plurality of flash EEPROM chips according to the erasure block, a memory size of the each sequential sector number sets being equal to a memory size of the erasure block, and for holding address conversion information representing a correspondence of logical addresses having track numbers and sector numbers to real memory addresses of said plurality of flash EEPROM chips according to results of the assigning;

address converting means for converting the logical address designated by a host system, into the real memory address for accessing at least one of said plurality of flash EEPROM chips based on the address conversion information; and control means for outputting the control signal to a first flash EEPROM chip of said plurality of flash EEPROM chips in accordance with the real memory address converted from the logical address by said address converting means and outputting the control signal to a second flash EEPROM chip of said plurality of flash EEPROM chips during write processing of the first flash EEPROM chip.

2. The system according to claim 1, further comprising means for holding structure information representing the number of sectors for each track, assigned to said plurality of flash EEPROM chips.

3. The system according to claim 2, wherein said holding means includes means for supplying said structure information to the host system.

4. A system according to claim 1, further comprising:

means for performing a swapping process for averaging numbers of a respective write operation of each memory area corresponding to one track in logical addresses.

5. A system according to claim 4, wherein said address converting means further comprises a group information holding means for holding group information having real memory addresses corresponding to the sector numbers assigned to one track, whereby said performing means performs the swapping process based on the group information held by said group information holding means.

6. A system according to claim 1, wherein said address conversion information comprises first address conversion data and second address conversion data, said first address conversion data including a first logical address and a first real memory address and said second address conversion data including a second logical address, which is composed of a same track number and a different sector number with the first logical address, and a second real memory address, said system further comprising: address swapping means for swapping the first real memory address and the second real memory address.

7. A system according to claim 1, further comprising:

counting means for counting a number of writing operations in units of memory areas each having a predetermined size, of said plurality of flash EEPROM chips;

determining means for, in response to a write request area from the host system, determining whether a difference between a writing number of the write request area and a smallest writing number of writing numbers of memory areas corresponding to a track number of a logical address of the write request area is equal to or larger than a predetermined number; and changing means for changing the address conversion information in order to exchange real memory addresses of the memory areas of the smallest writing number for real memory addresses of the write request area if said determining means determines the difference is equal to or larger than the predetermined number; and said controls means controls the writing operation of the plurality of flash EEPROM chips in order to write data stored in an area of the smallest writing number on the write request area and to write the write request data on the memory areas of the smallest writing number, if said determining means determines the difference is equal to or larger than the predetermined number.

8. A system according to claim 7, wherein said address converting means has a group information holding means for holding group information having real memory addresses corresponding to the sector numbers assigned to one track; and said system further comprises disable means for disabling said changing means and control means according to the group information except that the write request area and the memory area of the smallest writing number are included in a same track or a same chip of said plurality of flash EEPROM chips.

9. A semiconductor memory system comprising:

i flash EEPROM chips, where i is an integer larger than 1, a data read/write operation being executed with respect to each of the flash EEPROM chips in units of one page whose size is m bytes, and a data erasing operation being executed with respect to each of the flash EEPROM chips in units of one block whose size is m x n, wherein m is an integer larger than 0, and n is an integer larger than 1;

memory for storing address information, said address information representing how consecutive logic addresses corresponding to one track are assigned to physical addresses of the i flash EEPROM chips in units of said one block, said logical addresses being designated from a host system connected to the semiconductor memory system by use of a track number and a sector number; and means, responsive to a request made by the host system, for accessing at least one of the i flash EEPROM chips in parallel, in accordance with the address information stored in the memory.

10. A system according to claim 9, further comprising means for performing a swapping process for averaging numbers of a respective write operation of each memory area corresponding to one track in logical addresses based on the plurality of data held by said holding means.

* * * * *